United States Patent
Koelling et al.

(10) Patent No.: US 10,727,084 B2
(45) Date of Patent: *Jul. 28, 2020

(54) METHOD FOR CREATING THROUGH-CONNECTED VIAS AND CONDUCTORS ON A SUBSTRATE

(71) Applicant: Samtec, Inc., New Albany, IN (US)

(72) Inventors: Fred Koelling, Foster City, CA (US); Alan D. Nolet, Hillsborough, CA (US); Daniel Long, El Dorado Hills, CA (US)

(73) Assignee: SAMTEC, INC., New Albany, IN (US)

(*) Notice: Subject to any disclaimer, the term of this patent is extended or adjusted under 35 U.S.C. 154(b) by 0 days.

This patent is subject to a terminal disclaimer.

(21) Appl. No.: 16/778,603

(22) Filed: Jan. 31, 2020

(65) Prior Publication Data

US 2020/0168474 A1    May 28, 2020

Related U.S. Application Data

(63) Continuation of application No. 15/861,518, filed on Jan. 3, 2018, now Pat. No. 10,593,562, which is a
(Continued)

(51) Int. Cl.
*H01L 21/48* (2006.01)
*B22F 1/02* (2006.01)
(Continued)

(52) U.S. Cl.
CPC .......... *H01L 21/486* (2013.01); *B22F 1/025* (2013.01); *B22F 3/15* (2013.01); *B22F 7/08* (2013.01);
(Continued)

(58) Field of Classification Search
None
See application file for complete search history.

(56) References Cited

U.S. PATENT DOCUMENTS 4,544,577 A    10/1985    May
4,663,215 A    5/1987    Dubuisson et al.
(Continued)

FOREIGN PATENT DOCUMENTS

EP    1419990 A2    5/2004
SU    1621192 A1    1/1991
(Continued)

OTHER PUBLICATIONS

Nomura et al., "Application of I-structure though-glass interconnect filled with submicron gold particles to a hermetic sealing device", Journal of Micromechanics and Microengineering, 2016, 26, 105018, 7 pages.
(Continued)

*Primary Examiner* — Andres Munoz
(74) *Attorney, Agent, or Firm* — BakerHostetler

(57) ABSTRACT

A method to reduce the number and type of processing steps to achieve conductive lines in the planes of a substrate concurrently interconnecting conductor through the substrate, by forming structures in the planes of a substrate. These structures may include interconnect lines, bond pads, and other structures, and improve the performance of subsequent unique processing while simultaneously reducing the manufacturing complexity to reduce time and cost. These structures are formed by selective etching using chemical mechanical polishing, and then completed using a single fill step with a conductive material.

17 Claims, 16 Drawing Sheets

Related U.S. Application Data continuation-in-part of application No. 15/634,953, filed on Jun. 27, 2017, now abandoned, which is a continuation-in-part of application No. 15/090,164, filed on Apr. 4, 2016, now Pat. No. 9,691,634.

(60) Provisional application No. 62/142,458, filed on Apr. 2, 2015.

(51) Int. Cl.
*B22F 3/15* (2006.01)
*H01L 23/498* (2006.01)
*B22F 7/08* (2006.01)
*H01L 23/15* (2006.01)

(52) U.S. Cl.
CPC .... *H01L 23/49827* (2013.01); *B22F 2301/25* (2013.01); *H01L 23/15* (2013.01); *H01L 23/49866* (2013.01)

(56) References Cited

U.S. PATENT DOCUMENTS

| | | | |
|---|---|---|---|
| 5,269,880 A | 12/1993 | Jolly et al. | |
| 5,281,684 A * | 1/1994 | Moore | H01L 24/11 427/97.5 |
| 5,891,283 A * | 4/1999 | Tani | H01L 23/15 156/89.11 |
| 6,515,237 B2 | 2/2003 | Kikuchi et al. | |
| 6,852,627 B2 | 2/2005 | Sinha et al. | |
| 7,084,073 B2 | 8/2006 | Lee et al. | |
| 7,452,568 B2 | 11/2008 | Hougham et al. | |
| 7,471,384 B2 | 12/2008 | Nomaru et al. | |
| 7,569,421 B2 | 8/2009 | Do et al. | |
| 7,902,638 B2 | 3/2011 | Do et al. | |
| 7,960,841 B2 | 6/2011 | Do et al. | |
| 8,298,151 B2 | 10/2012 | Riobo et al. | |
| 8,338,957 B2 | 12/2012 | Nilsson | |
| 8,486,823 B2 | 7/2013 | Chiou et al. | |
| 8,492,878 B2 | 7/2013 | Farooq et al. | |
| 8,552,564 B2 | 10/2013 | Roy et al. | |
| 8,580,647 B2 | 11/2013 | Yen et al. | |
| 8,716,131 B2 | 5/2014 | Chen et al. | |
| 8,871,641 B2 | 10/2014 | Nilsson | |
| 8,928,151 B2 | 1/2015 | Roy et al. | |
| 9,012,324 B2 | 4/2015 | Chen et al. | |
| 9,059,161 B2 | 6/2015 | Andry et al. | |
| 9,130,016 B2 | 9/2015 | Urruti | |
| 9,184,135 B1 | 11/2015 | Mobley et al. | |
| 9,215,801 B2 | 12/2015 | Takahashi et al. | |
| 2001/0033891 A1 * | 10/2001 | Ami | H01L 23/49827 427/126.3 |
| 2003/0017687 A1 | 1/2003 | Hembree | |
| 2004/0119593 A1 | 6/2004 | Kuhns | |
| 2005/0054201 A1 | 3/2005 | Vijayakumar et al. | |
| 2005/0148164 A1 | 7/2005 | Casey et al. | |
| 2005/0200027 A1 | 9/2005 | Sinha et al. | |
| 2007/0251088 A1 | 11/2007 | Susaki et al. | |
| 2008/0272465 A1 | 11/2008 | Do et al. | |
| 2011/0147071 A1 | 6/2011 | Maijala et al. | |
| 2012/0235969 A1 | 9/2012 | Burns et al. | |
| 2013/0034687 A1 | 2/2013 | Koike et al. | |
| 2013/0034688 A1 | 2/2013 | Koike et al. | |
| 2013/0050226 A1 | 2/2013 | Shenoy et al. | |
| 2013/0186675 A1 | 7/2013 | Takahashi et al. | |
| 2013/0277844 A1 | 10/2013 | Chiou et al. | |
| 2013/0293482 A1 | 11/2013 | Burns et al. | |
| 2013/0328214 A1 | 12/2013 | Takano | |
| 2014/0104284 A1 | 4/2014 | Shenoy et al. | |
| 2014/0104288 A1 | 4/2014 | Shenoy et al. | |
| 2014/0203448 A1 | 7/2014 | Song et al. | |
| 2015/0076711 A1 | 3/2015 | Blanchard et al. | |

FOREIGN PATENT DOCUMENTS

| | | |
|---|---|---|
| WO | 88/05959 A1 | 8/1988 |
| WO | 2009/153728 A1 | 12/2009 |
| WO | 2012/078335 A2 | 6/2012 |
| WO | 2012/125481 A2 | 9/2012 |
| WO | 2013/033124 A1 | 3/2013 |
| WO | 2014/062310 A2 | 4/2014 |
| WO | 2014/062311 A2 | 4/2014 |

OTHER PUBLICATIONS

Toshinori, "Developments of Sub-micron Au Particle Bonding", Tanaka Kikinzoku Kogyo K.K., 2-73, Shinmachi, Hiratsuka, Kanagawa 254-0076, Japan, Feb. 22, 2016, 19 pages.

* cited by examiner

METHOD FOR CREATING THROUGH-CONNECTED VIAS AND CONDUCTORS ON A SUBSTRATE

CROSS-REFERENCE TO RELATED APPLICATIONS

This application is a continuation of U.S. patent application Ser. No. 15/861,518 titled "METHOD FOR CREATING THROUGH-CONNECTED VIAS AND CONDUCTORS ON A SUBSTRATE", filed on Jan. 3, 2018, which is a continuation-in-part of U.S. patent application Ser. No. 15/634,953 titled "METHOD FOR CREATING THROUGH-CONNECTED VIAS AND CONDUCTORS ON A SUBSTRATE", filed on Jun. 27, 2017, which is a continuation-in-part of U.S. patent application Ser. No. 15/090,164 titled "METHOD FOR CREATING THROUGH-CONNECTED VIAS AND CONDUCTORS ON A SUBSTRATE", filed on Apr. 4, 2016, now issued as U.S. Pat. No. 9,691,634 on Jun. 27, 2017, which claims the benefit of, and priority to, U.S. provisional patent application Ser. No. 62/142,458, titled "System and Method for Creating Through-Connected Vias and Conductors on a Glass Substrate", which was filed on Apr. 2, 2015, the entire specification of each of which are incorporated herein by reference.

BACKGROUND

Field of the Art

The disclosure relates to the field of semiconductors, and more particularly to the manufacture and testing of semiconductors with complex conductive structures.

Discussion of the State of the Art 2.5-D and 3-D packaging is a novel implementation of an already well-established concept that previously was referred to as MCMs (multichip modules). A thin glass, silicon or other dielectric substrate material is created having a plurality of holes or vias that are metalized in such a manner as to create a connection between one circuit plane and a second circuit plane. The integrated circuit packaging industry refers to these interconnection substrates as interposers. Holes fabricated into the interposer are typically very small, for example, 5 µm to 100 µm in diameter and 50 µm to 500 µm in depth. The number of holes per square centimeter may be in the hundreds or even thousands. Following the processing necessary to fabricate these holes the next step is to metalize the hole to provide for an electrically conductive pathway from one circuit plane or substrate to another.

Current state of the art processes known as "copper electroplate" methods for metalizing interposer through and blind holes are very costly and lack manufacturing scalability. The metallization methods include a combination of pressure vapor deposition (PVD) or sputtering deposition to form a seed layer followed by copper electroplating. The sputtering or PVD methods along with very sophisticated copper electroplating operations are very costly in materials and operational expense and require highly trained technicians to operate the process. The equipment necessary to run these processes is extremely expensive and difficult to scale to high-throughput manufacturing. The copper electroplating process takes 1 to 8 hours for each substrate, depending on hole diameter and aspect ratio. The electroplating process requires each substrate to be electroplated in an individual process cell having sophisticated analytical and dispensing controls and precision electrical field distribution across the substrate.

Electroplated copper deposits extending beyond the surface of the substrate are referred to in the art as "over burden". To level the copper electroplate deposit flush or planar to the substrate surface requires a secondary process using chemical-mechanical polishing (CMP). Maintenance and operation of the CMP process requires highly skilled technicians for monitoring and control to achieve consistent results. Copper is a relatively soft metal and methods used to mechanically remove the excess copper are constrained by the loading of the soft copper into the abrasive material.

A second means of depositing copper or other conductive materials into via holes in interposer substrates utilizes metallic inks. The metallic inks typically are formulated using metal powder dispersed in a bonding resin or other polymer for ease of hole filling and a capping agent to prevent the metallic powder from oxidizing. After the holes are filled with the metallic ink along with the resin or capping agents it is necessary to volatize all organic materials and remove them from the metallic powder to achieve reasonable electrical conductivity. Temperatures required for volatizing these organic compounds may reach 400° C. to 500° C. The carbon ash left after volatizing the organic compounds may negatively impact optimal conductivity and leave significant potential for discontinuous filling of the hole. The potential for discontinuous or electrically open areas in the filled hole or via is unacceptable.

Most of these processes work only on a very limited hole length/width ratio, and narrow or extra wide holes are very difficult to manufacture in a consistent manner.

What is needed is a system and method whereby a silicon, glass or other dielectric or semiconductor substrate material having through or blind vias may be metalized with a highly conductive metal at very low operational or material cost and with limited requirements for highly trained technical personnel. The process is easily scaled and equipment costs are significantly less than all other process methods. The resulting metallization of the hole is electrically conductive (approaching that of bulk copper), is resistant to oxidation during thermal cycling tests, and has little to no potential for discontinuous or electrically open vias.

Also needed is the ability to manufacture a wide range of aspect ratios of the holes on one substrate, for example, to reach a required via density in a conduction area, as well as fill very wide holes as thermal transfers for cooling components mounted on said substrates/interposers.

SUMMARY OF THE INVENTION

Accordingly, the inventors have conceived, and reduced to practice, a system and various methods for creating metallizing through-connected vias and conductors structures within or on a substrate.

The embodiments disclosed herein provide ways to reduce the number and type of processing steps to achieve conductive lines in the planes of a substrate concurrently interconnecting conductor through the substrate, by forming structures in the planes of a substrate. These structures may include interconnect lines, bond pads, and other structures, and improve the performance of subsequent unique processing while simultaneously reducing the manufacturing complexity to reduce time and cost. These structures are formed by selective etching using chemical mechanical polishing various methods including laser ablation and or wet etching, masking and wet or dry etching, or laser induced phase change and selective etching, and then completed metallized using a single unique fill step or steps with a conductive material.

According to a preferred embodiment of the invention, a method for creating electrically or thermally conductive vias or structures in both vertical and horizontal orientations in a dielectric material, comprising the steps of: (a) delete A as a claim and start with b as our first claim creating vias and lines in a planar surface of a dielectric material by etching trenches and holes into the dielectric material; (b) depositing a dry powder comprising metallic particles on or in the dielectric material; (c) polishing the powder of metallic particles into the etched trenches and holes; (d) applying a non-polar solvent to one or more planar surfaces of the dielectric material; (e) drying compacting the deposited powder of metallic particles to further densify them; (f) may or may not repeating steps (a)-(e) on a reverse side of the dielectric material; and (g) repeating steps (a)-(f) until no unfilled structures are detected, is disclosed.

According to another embodiment of the invention, the metallic particles are comprised of one of a pure metal, an alloyed metal, and a mixture of pure metals. In a further embodiment, the powder is comprised of nanometer, sub-nanometer, micron or sub-micron sized metallic particles. In yet another embodiment, the resulting thermally or electrically conductive vias are planar to a surface of the dielectric material. In a further embodiment, the method further comprises the step of utilizing rotational and vibratory forces to achieve a desired fill density of the through or blind, or horizontal vias. In yet another embodiment of the invention, the method further comprises the step of applying a non-polar solvent to one or more planar surfaces of the dielectric material to cause coalescence, or flow of the metallic particles within vias, thereby achieving further densification thereof. In yet another embodiment of the invention, the method further comprises the steps of encapsulating the dielectric material in a polymer envelope and subjecting the envelope to vacuum sealing to create a tight seal between the dielectric material and an inner layer of the polymer envelope. In yet another embodiment of the invention, the method further comprises the step of subjecting the polymer envelope to an isostatic pressure and a constant temperature to maximize via fill density and to cause particle-to-particle contact, deformation, or compression bonding or sintering of the metallic particles. In another embodiment of the invention, the constant temperature is heat is applied to the filled vias and structures, selected based at least on a material type of the metallic particles and a via aspect ratio of the dielectric material.

DESCRIPTION OF EMBODIMENTS

Figure 1:
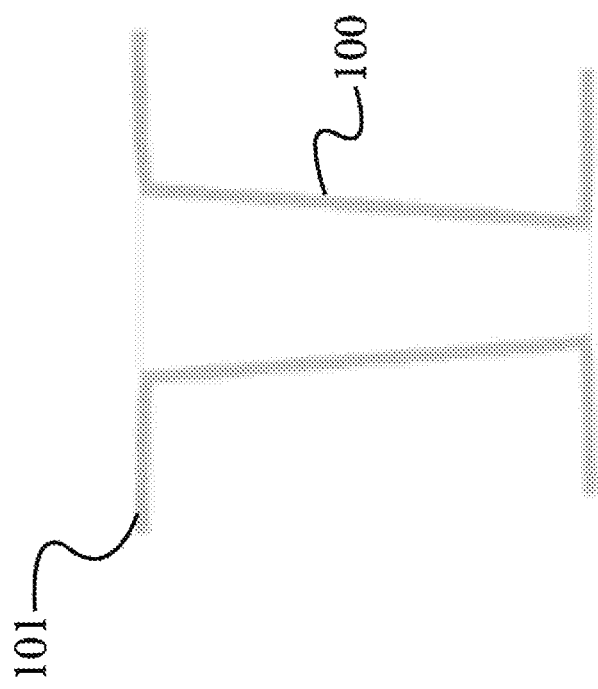
FIG. 1 shows an example of a cross-section of a through-hole via formed into a substrate.

One or more different inventions may be described in the present application. Further, for one or more of the inventions described herein, numerous alternative embodiments may be described; it should be appreciated that these are presented for illustrative purposes only and are not limiting of the inventions contained herein or the claims presented herein in any way. One or more of the inventions may be widely applicable to numerous embodiments, as may be readily apparent from the disclosure. In general, embodiments are described in sufficient detail to enable those skilled in the art to practice one or more of the inventions, and it should be appreciated that other embodiments may be utilized and that structural, logical, software, electrical and other changes may be made without departing from the scope of the particular inventions. Accordingly, one skilled in the art will recognize that one or more of the inventions may be practiced with various modifications and alterations. Particular features of one or more of the inventions described herein may be described with reference to one or more particular embodiments or figures that form a part of the present disclosure, and in which are shown, by way of illustration, specific embodiments of one or more of the inventions. It should be appreciated, however, that such features are not limited to usage in the one or more particular embodiments or figures with reference to which they are described. The present disclosure is neither a literal description of all embodiments of one or more of the inventions nor a listing of features of one or more of the inventions that must be present in all embodiments.

Headings of sections provided in this patent application and the title of this patent application are for convenience only, and are not to be taken as limiting the disclosure in any way.

A description of an embodiment with several components in communication with each other does not imply that all such components are required. To the contrary, a variety of optional components may be described to illustrate a wide variety of possible embodiments of one or more of the inventions and in order to more fully illustrate one or more aspects of the inventions. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred. Also, steps are generally described once per embodiment, but this does not mean they must occur once, or that they may only occur once each time a process, method, or algorithm is carried out or executed. Some steps may be omitted in some embodiments or some occurrences, or some steps may be executed more than once in a given embodiment or occurrence.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of embodiments of the present invention in which, for example, functions may be executed out of order from that shown or discussed, including substantially concurrently or in reverse order, depending on the functionality involved, as would be understood by those having ordinary skill in the art.

The manufacturing methods and materials used relate primarily but not exclusively to current integrated circuit packaging standards for both 2.5-D and 3-D stacked integrated circuits; particularly to those standards requiring the use of a dielectric substrate (referred to by industry as an interposer) and more particularly to the design of a novel low cost, high reliability via (blind and through-hole) metallization method for high volume manufacturing.

In a preferred embodiment, the silver coated or capped copper, or silver particulate is removed from the non-polar solvent and dried. The dried metallic particulate is size filtered and sifted onto the substrate. The substrate is typically thin glass, silicon or quartz materials having a plurality of small holes. The holes may be drilled completely through the substrate or in some cases only partially through the substrate to form blind holes. The hole diameter requirements have no upper limit. Typical hole diameters of 10 μm to 25100 μm with depths typically 100 μm to 500 μm are common. The aspect ratio between hole diameter and hole depth are unlimited for this process. Additionally a plurality of different hole diameters may be placed in the same substrate. A vibration table is set to a frequency such that the nanometric metallic particulate that has been sifted or sprayed onto the substrate surface moves from one side of the substrate to the other. Choice of the correct frequency allows the metallic particulate to fill all the blind and through holes to the ideal or best possible particle density. After the holes in the substrate have been filled and all remaining metallic particles on the substrate surface have been removed the substrate surface is exposed to a thin layer of a non-polar solvent. The solvent causes a coalescence of the metallic particles and thus a partial cementing or interlocking of the particulate within the hole in the substrate.

In yet another method for filling through hole vias with nanometer micron/nanometric sized particles, the requirement for post chemical/mechanical planarizing to the substrate compaction is eliminated so as to achieve high particle density. In this approach, the micron/nanometric silver capped copper particulate is removed from the non-polar solvent and dried. The dried metallic particulate is size-filtered and sifted onto the substrate. The substrate is typically thin glass, silicon, or quartz materials having a plurality of small holes. The holes may be drilled completely through the substrate or in some cases only partially through the substrate to form blind holes. The hole diameter requirements have no upper limit. Typical hole diameters of 10 μm to 25100 μm with depths typically 100 μm to 500 μm are common. The aspect ratio between hole diameter and hole depth are unlimited for this process. Additionally a plurality of different hole diameters may be placed in the same substrate. A vibration table may be set to a frequency such that the nanometric micron/nanometric metallic particulate that has been sifted or sprayed onto the substrate surface moves from one side of the substrate to the other. Choice of the correct frequency allows the metallic particulate to fill all the blind and through holes to the ideal or best possible particle density. After the holes in the substrate have been filled and all remaining metallic particles on the substrate surface have been removed, the substrate surface is exposed to a thin layer of a non-polar solvent. The solvent causes a coalescence of the metallic particles and thus a partial cementing or interlocking of the particulate within the hole in the substrate. It will be appreciated by one having ordinary skill in the art that, while embodiments described herein describe the use of nanometer sized particles to fill through-hole vias, other particle sizes may be used as long as the particles are sufficiently small to effectively fill the through-hole vias (since as already noted the dimensions of such vias may vary widely in the art). For example, both sub-micron and sub-nanometer micron/nanometric size particles may be used, according to the invention. Further, besides the proffered embodiment of silver coated copper nano-particles, other noble metal coatings on the outside (i.e., to an exterior surface) of a less noble metal core particle, or pure metal particles, may be used, allowing for easier processing, better conductivity, and hermeticity. Also, in some cases, the sizes may not be strictly in the nano-particle size range, but may also be larger or smaller, as suitable and sometimes desired for various reasons. Furthermore, in some embodiments the metal mixture may be applied such that a noble metal alloy coating is applied to an exterior surface of a less noble metal or metal alloy core particle, allowing for easier processing better conductivity and hermeticity.

Further, there is yet another method for densification of the deposited nanometer-sized particles into the through hole via to achieve stable and uniform conductivity across all through and blind holes. In this case, after all the holes or vias in the substrate have been filled with the nanometric metallic particulate, the substrate is covered, on both the bottom and top surface, with a thin (0.025 mm) aluminum or other non-contaminating metallic sheet. In some cases metallized or non-metallized suitable thin plastic foil may be used. The metal chosen has no adhesion to the nanometric-sized metal particulate under high pressure and temperature. The substrate, along with the thin metal covering, is placed into a hermetically sealed bag or envelope that is heat-sealed on three of the four sides. The hermetic envelope, along with the substrate that has been placed inside, is subjected to a vacuum to remove any remaining gas from inside the envelope and then mechanically or heat-sealed on the remaining fourth edge. The substrate within the gas-impervious envelope is placed inside a warm isostatic pressure (WIP) chamber. Depending on the metallic particulate type, size and fill density, the pressure chamber is set at 5000 psi to 30,000 psi and at a temperature of 120 C to 200 C for a time period sufficient to cause the metallic particulate surfaces to sinter or diffuse together. The substrate is removed from the gas-impervious envelope and the holes are refilled again with the metallic particulate to the top surface of the substrate. The substrate is again placed into a vacuum sealed gas-impervious envelope and reprocessed for a certain time, temperature, and pressure as suited for the size and type of nanometric metallic powder. The process of filling and pressurizing at the correct temperature is repeated until the holes or vias filled with the metal particulate is planar to the surface(s) of the substrate. It will be appreciated by those having ordinary skill in the art that other chamber conditions than WIP may be used according to the invention, depending generally on the particulate material and via aspect ratio used. For example, in some embodiments cold isostatic pressure (CIP) (typically below 120 C) or high-temperature isostatic pressure (HIP) (typically above 200 C) chambers may be used in place of WIP chambers.

FIG. 1 shows an exemplary cross-section of a through-hole via 100 formed into a substrate 101. The via cavity in substrate 101 may have many shapes, including but not limited to cylindrical, tapered cylindrical, and hourglass. Various methods may be used to create such cavities, including but not limited to etching, ion milling or ion beam etching, laser drilling, or any other methods or combinations of methods suitable for creating cavities in a substrate material.

Figure 2:
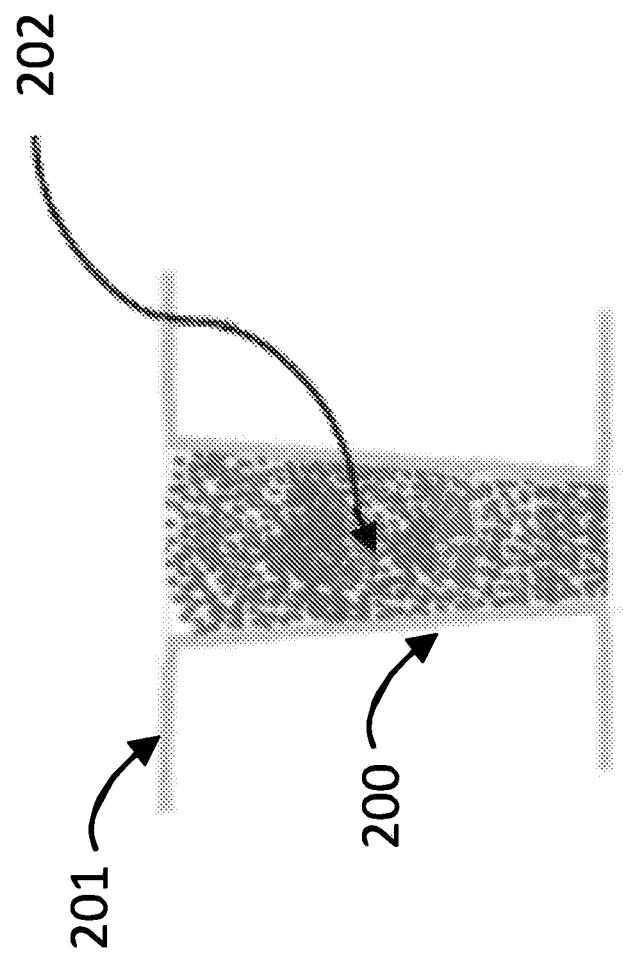
FIG. 2 shows a cross-section of the through-hole via filled with the silver coated micron/nanometric nanometric-sized copper particles.

FIG. 2 shows an exemplary cross-section of through-hole via 200 filled with silver-coated, nanometer-sized copper particles 202 filling a cavity in substrate 201. In some arrangements, cavities may be filled from both opposite sides of a substrate, as needed.

Figure 3:
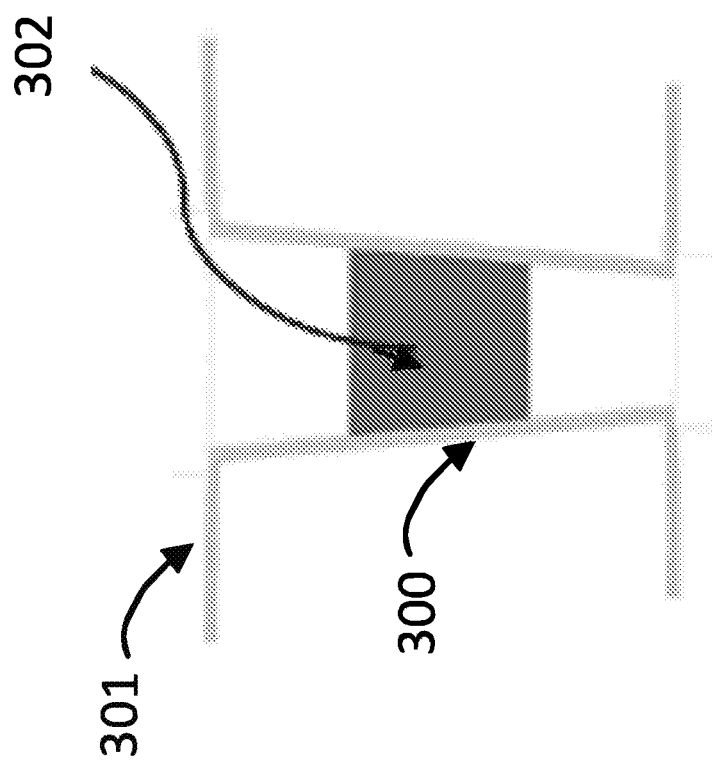
FIG. 3 shows a cross-section demonstrating the first stage compression or densification of micron/nanometric the nanometric-sized silver coated copper particles, with typical volume reductions of 30 percent.

FIG. 3 shows an exemplary cross-section of a through hole 300 in substrate 301, demonstrating first-stage compression or densification of nanometer-sized silver-coated copper particles 302. Typical volume reductions are about 30 percent.

Figure 4:
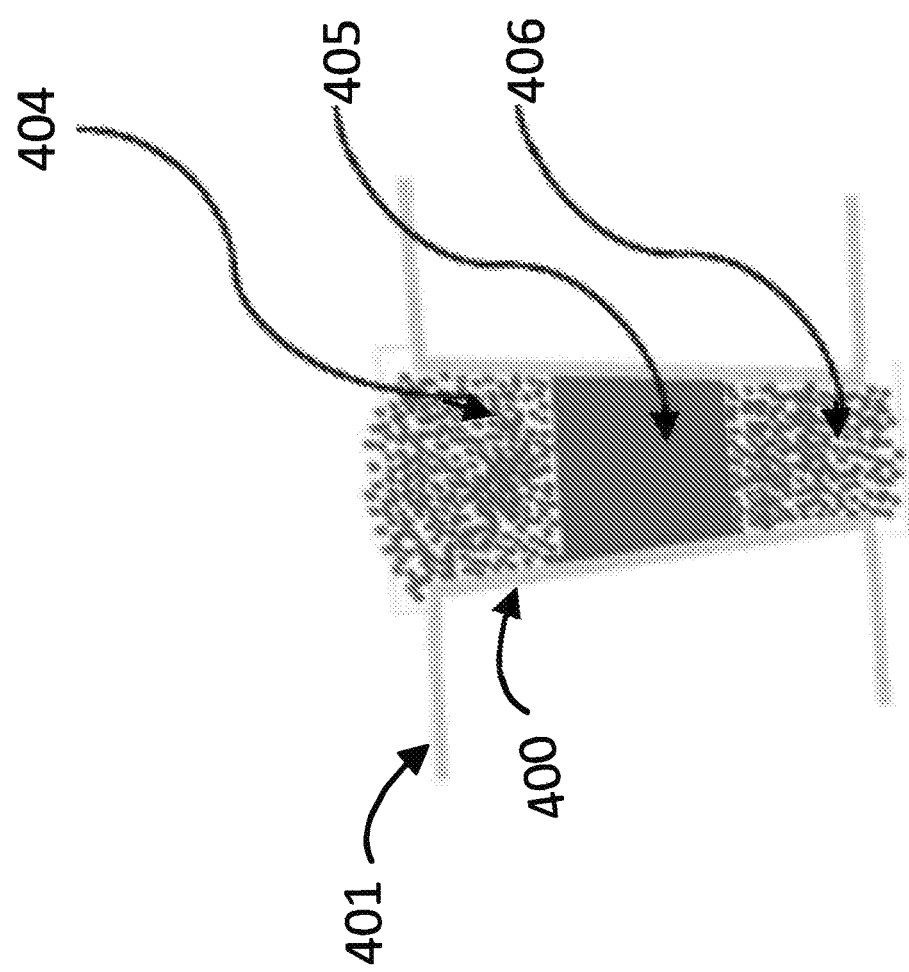
FIG. 4 shows a cross-section of a second filling of the through-hole via, with the top and bottom newly added micron/nanometric the nanometric-sized silver coated and the center previously densified portion of the micron/nanometric nanometric silver-coated copper particulate.

FIG. 4 shows an exemplary cross-section of a through hole 400 in substrate 401, demonstrating a second filling of the through-hole via in three sections, with the nanometric-sized silver-capped particles 404 and 406 and the densified portion of the nanometric silver-coated copper particulate 405, which was previously created.

Figure 5:
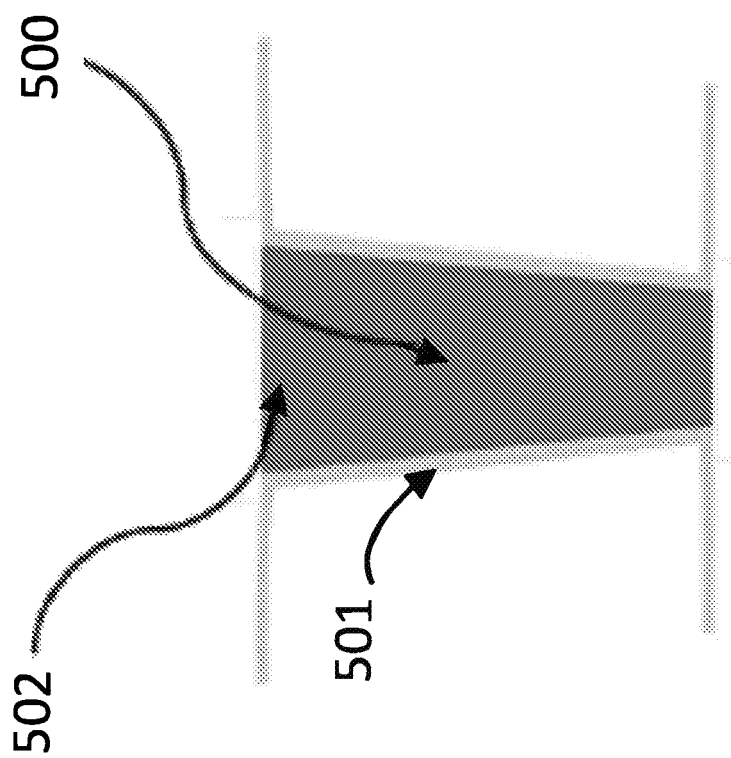
FIG. 5 shows a cross-section of the fully filled through-hole via after final compression or densification and sintering to form a planar level with the substrate surface.

FIG. 5 shows an exemplary cross-section of the fully filled through-hole 501 via after final compression or densification and sintering 500 to form a planar level with the glass surface 502.

Figure 6:
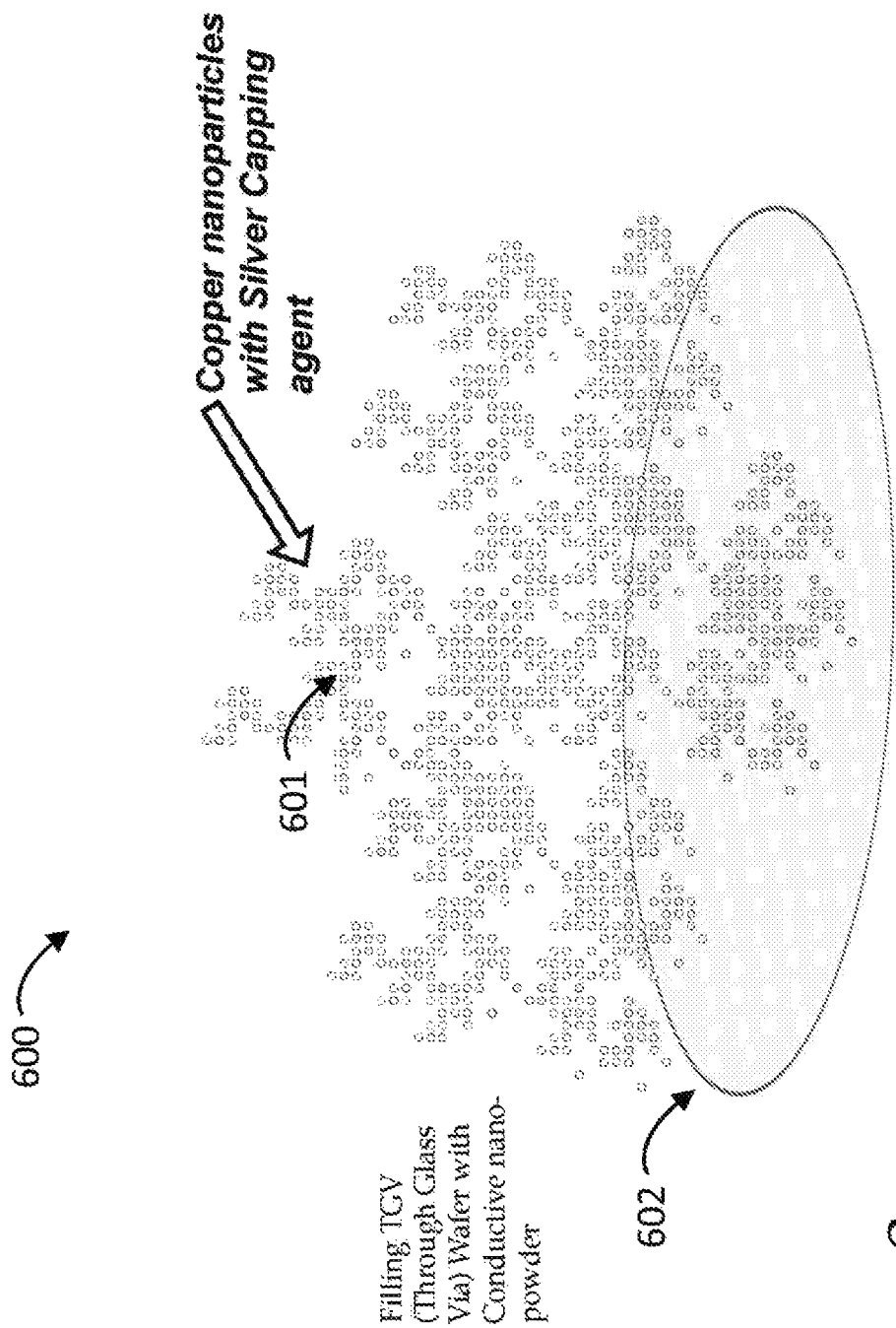
FIG. 6 shows particles being placed or dropped onto a substrate.
Figure 7:
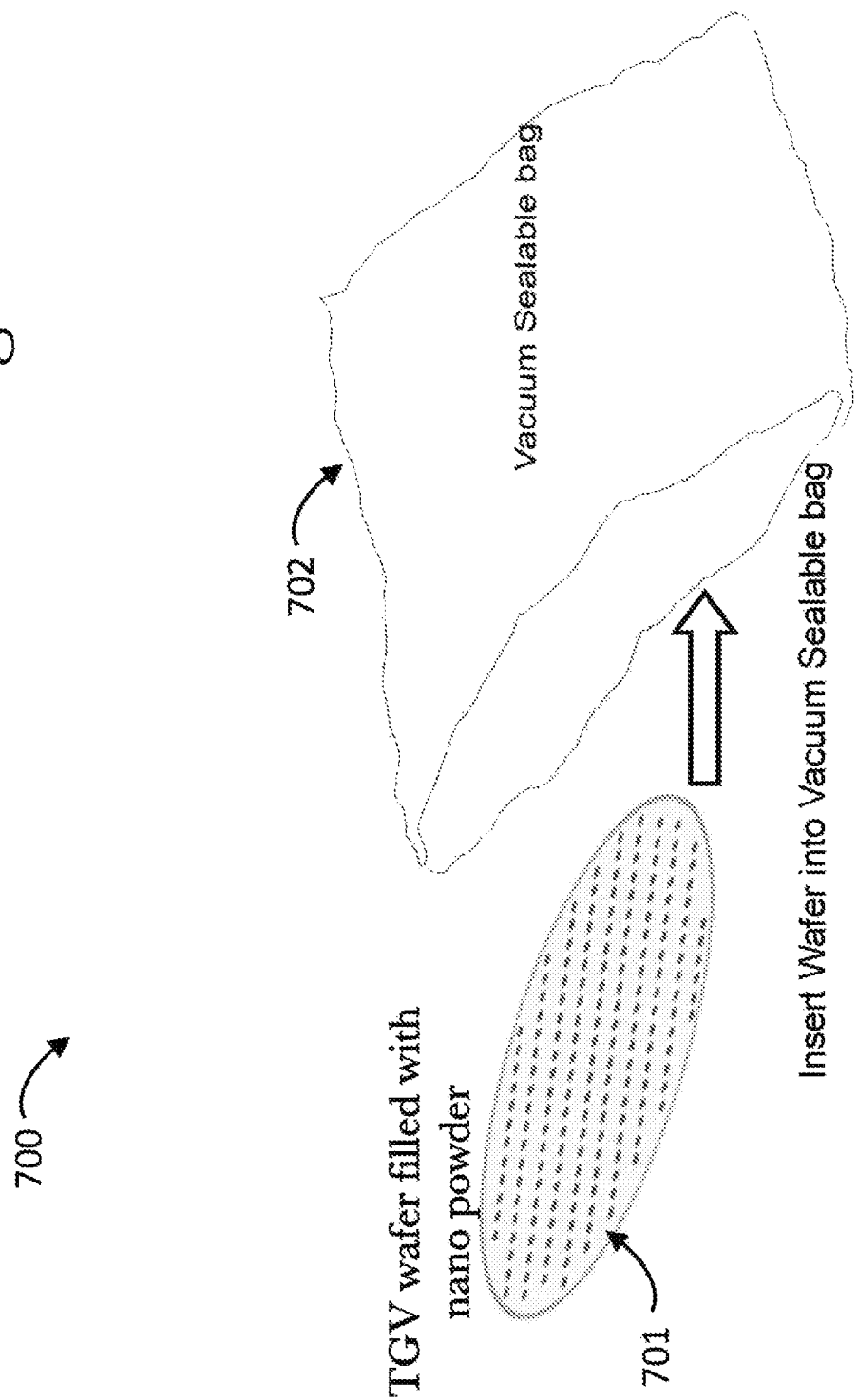
FIG. 7 shows a micron/nanometric nanoparticles-filled substrate being put into a vacuum-sealable bag.
Figure 8:
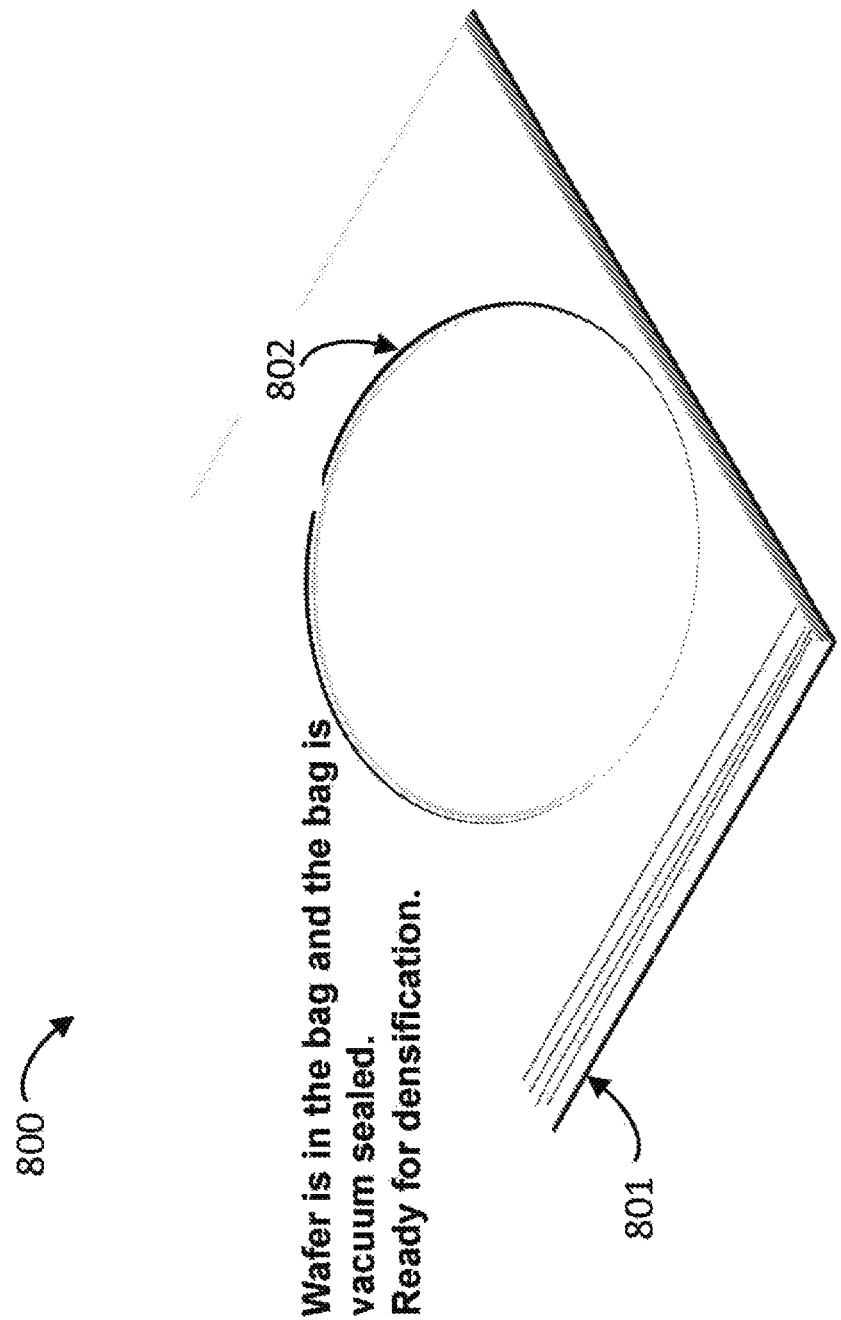
FIG. 8 shows a sealed bag and the outline of the substrate inside.

FIGS. 6-8 illustrate some exemplary use cases in which the following steps may be used to fill in the vias (or other openings) on the glass interposer or other substrate.

FIG. 6 shows a pseudo-isometric view 600 of particles 601 being placed or dropped onto a substrate 602 that has holes such as through-glass-via (TGV) or other via types, as well as inter-via connectors as grooves between some of them (not shown), before the deposition pads (not shown) are applied.

FIG. 7 shows a pseudo-isometric view 700 of the placement of a nanoparticles-filled substrate 701 (typically wafer sized) with TGVs and other features filled with metallic particles, and then substrate 701 being put into a vacuum-sealable bag 702, typically made of a metalized or non-metallized thin plastic foil.

FIG. 8 shows a pseudo-isometric view 800 of a sealed vacuum bag 801 showing the outline of the sealed-in substrate 802.

The following is a detailed description of the steps illustrated in FIGS. 6-8, according to an embodiment of the invention.

Step 1. Pour conductive metallic particles (such as nanometer-sized silver-coated copper) 601 onto a flat surface 602 of the glass to dry completely, as shown in FIG. 6. In some cases a vacuum and/or heat may be applied for drying purposes.

Step 2. Once the metallic particles are dry, begin polishing the powder into the glass substrate that has predrilled holes, using a standard polisher for wafer-sized objects. Typically the deposition system for the metallic particles utilizes either double- or triple-wheeled pads. Typically, the pad material is made, for example, from polyurethane and covered, for example, with a thin flexible silicone sock attached to the polishing machine. Other approaches may be used, such as squeegee systems, etc., or any functionally equivalent approach may be used.

Step 3. Repeat steps 1 and 2 on the reverse side of the substrate wafer.

Step 4. Check for any voids (holes that appear to be empty). If there are no voids, proceed to step 5. If there are voids, repeat from step 2. This ensures that the process does not continue until all holes have been filled properly.

Step 5. Remove excess metallic particles from both surfaces of the glass, typically with a squeegee type tool.

Step 6. Place glass substrate into a vacuum sealable bag, as shown in FIG. 7. The substrate, along with the thin metal covering, is placed into a hermetically-sealed bag or envelope that is heat-sealed on three of the four sides. In some cases, before the substrate is placed in the bag, after all the holes or vias and or grooves in the substrate have been filled with the metallic particles, the substrate is covered, on both the bottom and top surface, with a thin (0.025 mm) aluminum or other non-contaminating metallic sheet. The metal chosen should have no adhesion to the metallic particles under high pressure and temperature.

Step 7. Vacuum seal the bag, ensuring a good vacuum seal, as shown in FIG. 8. The sealed envelope along with the substrate that has been placed inside is subjected to a vacuum to remove any remaining gas from inside the envelope and is then mechanically or heat-sealed on the remaining fourth edge.

Step 8. Place in isostatic pressure system for densification. The substrate within the gas-impervious envelope is placed inside a WIP chamber. Depending on the metallic particulate type, size and fill density, the pressure chamber is set to 5000 psi to 30,000 psi and at a temperature of 120° C. to 200° C.

for a time period sufficient to cause the metallic particulate surfaces to sinter or diffuse together.

The substrate is removed from the envelope and the holes are re-filled again with the metallic particles to the top surface of the substrate. The substrate is again placed into a vacuum-sealed, impermeable envelope and reprocessed for a certain time, temperature and pressure as suited for the size and type nanometric metallic powder. The process of filing and pressurizing at the correct temperature is repeated until the holes or vias filled with the metallic particles are planar to the surface(s) of the substrate.

For example, the deposition system for the metallic particles utilizes either double- or triple-wheeled pads that are typically used for polishing of wafers. The deposition pad material, speed, pressure, etc. are somewhat important elements and subject to changes depending on the actual materials used for filling substrate, pressure used, etc. and may be tweaked differently for each combination for optimal results. Typically, the pad material is made from polyurethane and covered with a thin flexible silicone sock attached to the polishing machine. An important aspect is that the interface material between the metallic particles and the glass be such that the particles do not stick to the material and that the material be nonporous to the metallic particles actually used, typically in the 5 nm to 15 u nm range. Typically, the pressure on the deposition pads is set to approximately 0.25 kg (0.1-1.0 kg range) and the typical rotation speed is roughly between 120 to 160 (range 100-200) rpm. Additionally, in some cases, various vibrational frequencies in the range of 5000 to 20,000 oscillations per minute and amplitudes in the range of 0.2 mm to 0.6 mm may be applied to the glass substrate to further optimize results for a given combination of materials, etc. to obtain enhanced packing densities. Frequency and amplitude settings primarily are dependent on particle size; however, surface finish of the hole wall, hole diameter, depth, and geometry (i.e., cone, hour glass shape, etc.) all need to be considered for optimal vibrational settings.

Figure 9:
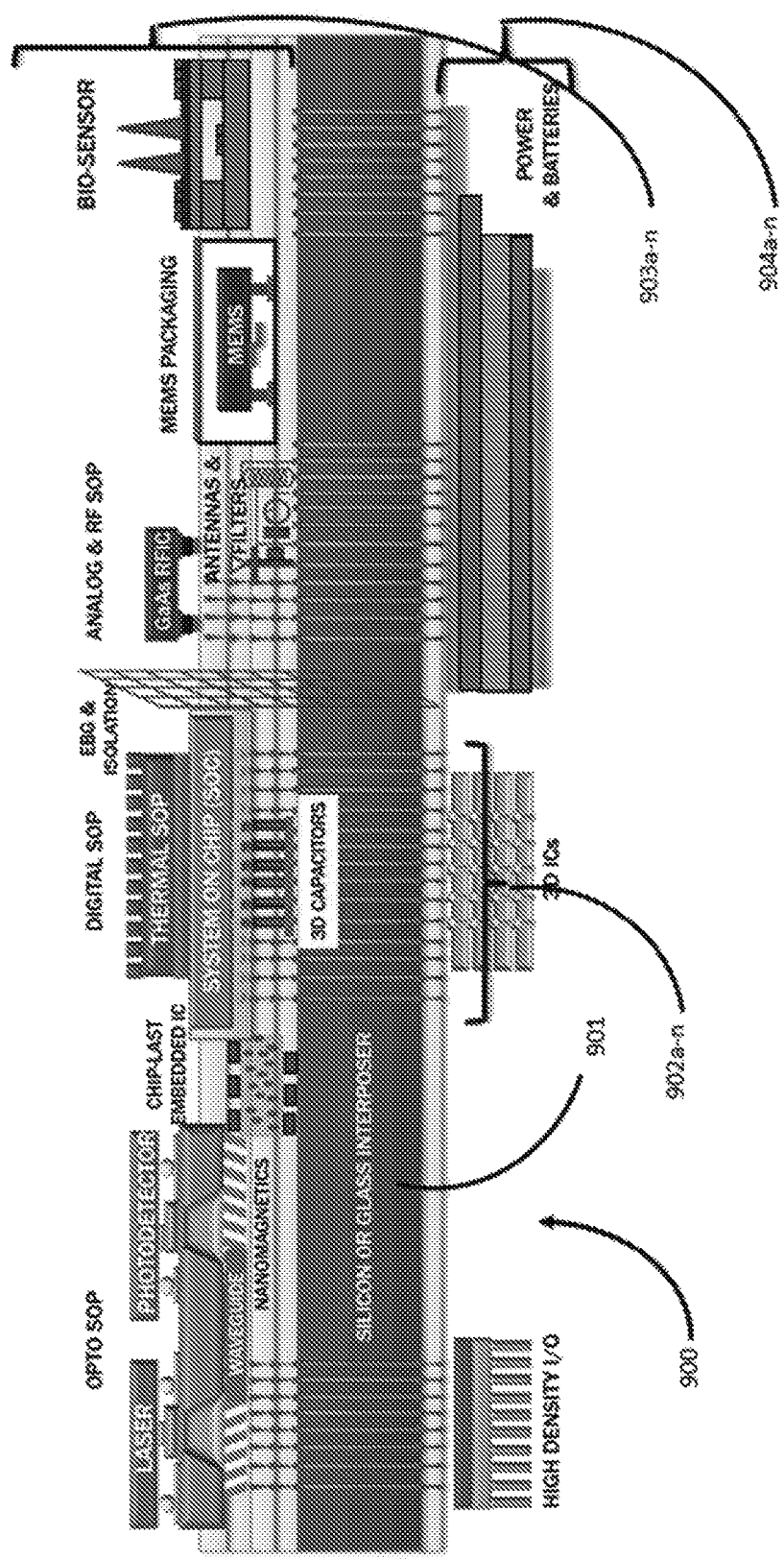
FIG. 9 shows an overview of an exemplary assembly of various components mounted on an interposer substrate.

FIG. 9 shows an overview of an exemplary assembly 900 of components discussed above and throughout, according to one aspect of the system and method disclosed herein. In this example, multiple devices 903a-n are set on top of glass interposer 901, and at the bottom are additional devices 904a-n. Interposer 901 has several sections of through-glass or through-silicon vias, including exemplary section 902a-n (other sections not numbered for clarity and simplicity). Additional interposer or other types of layers are shown in green as part of the assembly structure of devices 903a-n. These layers may be used for additional interconnections. Some interconnections may be made on either the top or the bottom of the glass or silicon interposer.

Figure 10:
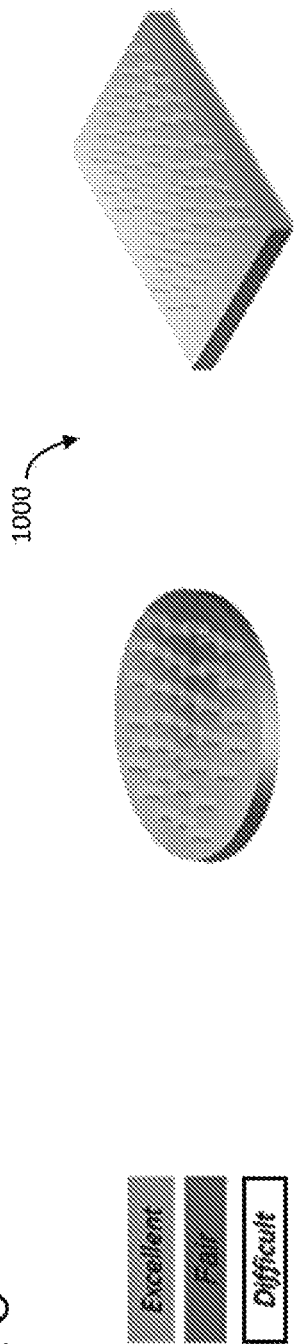
FIG. 10 shows a table comparing important features of silicon interposers and glass interposers.

FIG. 10 shows a table 1000 comparing features of silicon interposers and glass interposers. One of the biggest advantages of glass interposers is INSULATING PROPERTIES AT HIGH FREQUENCIES SUCH AS 3-70 GHz. full hermeticity; that is, it is possible to construct a completely hermetic enclosure, even at the size of a wafer. Additionally, a glass interposer offers optical transparency, a characteristic that is becoming increasing important as higher speeds often require an optical interface on a chip, so the ability to connect these optical interfaces through the glass makes this approach very valuable. This transparency may also be a strategic advantage for medical and bio-medical applications, such as, for example, a laser used to certain features that are being tested on the other side of the glass.

Figure 11:
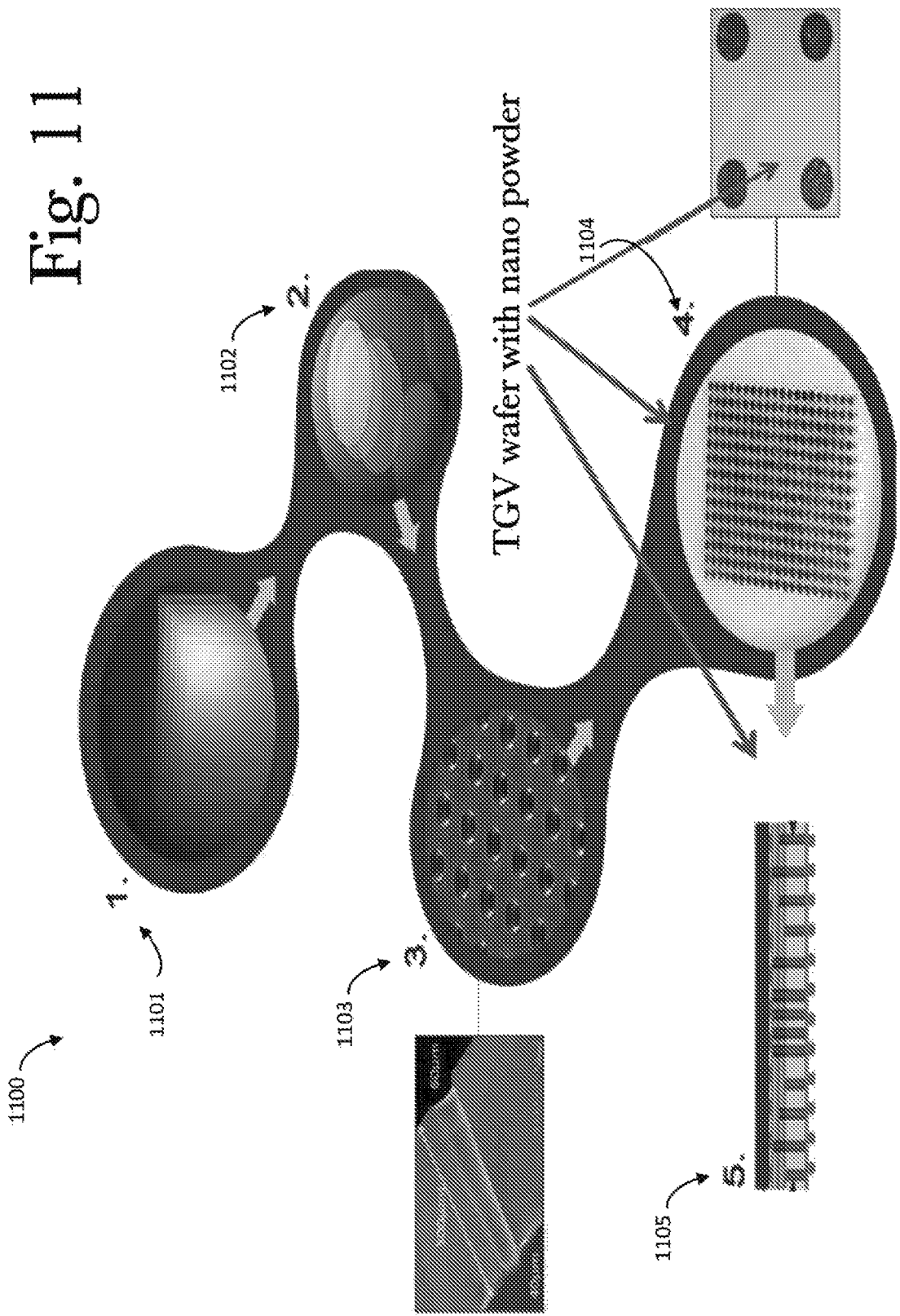
FIG. 11 shows a high-level representation of the interposer manufacturing process.

FIG. 11 shows a high-level representation of the interposer manufacturing process 1100, according to one aspect of the system and method disclosed herein. An initial step 1101 starts with proven high-volume display glass in sizes G2 through G4.5; in a next step 1102 the panel glass is cut into wafers 150 mm, 200 mm, or 300 mm in diameter. The wafers are then polished per design specifications, and an anodic bond layer is adhered. In a next step 1103 holes are drilled in the glass wafer. Holes are typically very small, for example, 5 μm to 100 μm in diameter and 50 μm to 500 μm in depth. In a next step 1104 the holes are filled and hermetically sealed surface finished coplanar with thermal coefficient of expansion (TCE) matched nano copper capped with silver to the substrate. Matching may involve changing the particle sizes (typically 5 nm to 5 um 5-20 nm) as well as the ratio of fill metal from silver to silver coated silver to copper (typically 1 percent to 8 percent silver to copper). In a final step 1105 the final interposers are patterned as per design specifications.

There are numerous applications for interposers in life science medical diagnostics and 3-D integration. Examples of medical diagnostic lab-on-a-chip (LOAC) include glass-EN-A1 type or similar substrate; cytop/ALX-hydrophobicity or similar coatings; pico pump and micro reactors formed in these, and quartz low-autofluorescence devices. Glass interposer packaging is also used in cell phones, tablets, displays, and sensors for remote diagnostics.

The main characteristics of a glass interposer through glass via (TGV) with micron/nanometric nano copper-filled material are as follows: the process is engineered to create low induced stress, may uses TCE matched nano copper capped with silver to the substrate. Matching may involve changing the particle sizes (typically 5-20 nm) as well as the ratio of silver to copper (typically 1 percent to 8 percent silver to copper); the holes are, for example, 25 μm diameter with a 130 μm pitch; wafers or substrates may be 250 μm to 500 μm thick, typically with 200 mm or 300 mm diameter. They may be supplied with high performance synthetic quartz or glass, are ideal for use with TSV for wafer level packaging (WLP), and hermetic. Redistribution layers may be applied, and the via provide conductivity between the layers.

As an interesting side effect, but one that also has applications of its own, the thin plastic foil, such as, for example, Mylar foil, used to protect the substrate during isostatic pressure densification may be imparted with a small amount of the nanoparticles, enabling creation of highly flexible conductors in those areas where the substrate has grooves for conductors. Because these conductors are not a topical layer, they are much less likely to break on repeated mechanical manipulations. Hence, in some cases, a substrate may be used with no vias but only grooves to create a conductive pattern on Mylar or some other, similar suitable thin plastic foil. After removal of the foil, the substrate may be etched free of metal and reused. By combining different materials in nanoparticle form, complete circuits may be imparted to various different kinds of foil.

In some cases, in a system for metalizing a silicon, glass or other dielectric substrate material with through or blind vias of a highly conductive metallic powder may be poured onto a flat surface to dry completely. When the metallic powder is dry, the powder is polished into a glass substrate that has pre drilled holes. Holes that appear to be empty may again be polished with the powder, and the process then repeated on the reverse side of the wafer. The excess metallic powder is then removed from both surfaces of the glass. The glass substrate may then be placed into a vacuum sealable bag, and the bag sealed. The sealed bag is placed in an isostatic pressure system for densification. The resulting substrate may be used for medical diagnostic LOAC applications such as, but not limited to, glass EN-A 1, Cytop/ALX-Hydrophobicity/Pico Pump/Micro reactors, and quartz low-auto fluorescence devices. It may also be used for glass interposer packaging such as, but not limited to, cell phones, tablets, displays and sensors for remote diagnostics, as well as for glass interposers for 2.5- and 3-D packaging; higher level of system integration; glass interposers for radio frequency (RF) applications, millimeter and microwave packaging; components for RF, millimeter and microwave devices; telecommunication (40 to 80 GHz); future telephones; test and burn-in socket components; lab-on-a-chip; photonics and optoelectronic components; micro-fluidics; MEMS (Micro-Electro-Mechanical systems) and bio chips; inkjet heads; wearable devices; personal electronic devices; and other applications. Further, filling through-hole vias with nanometer micron/nanometric sized particles may achieve precise coplanarity (on the order of less than 2 um either above or below the glass plane. achieve high particle density and eliminate requirement for post chemical/mechanical planarizing to the substrate. Additionally, densification of the deposited nanometer micron/nanometric size particles sized particles into the through-hole via may achieve stable and uniform conductivity across all through and blind holes.

Figure 12:
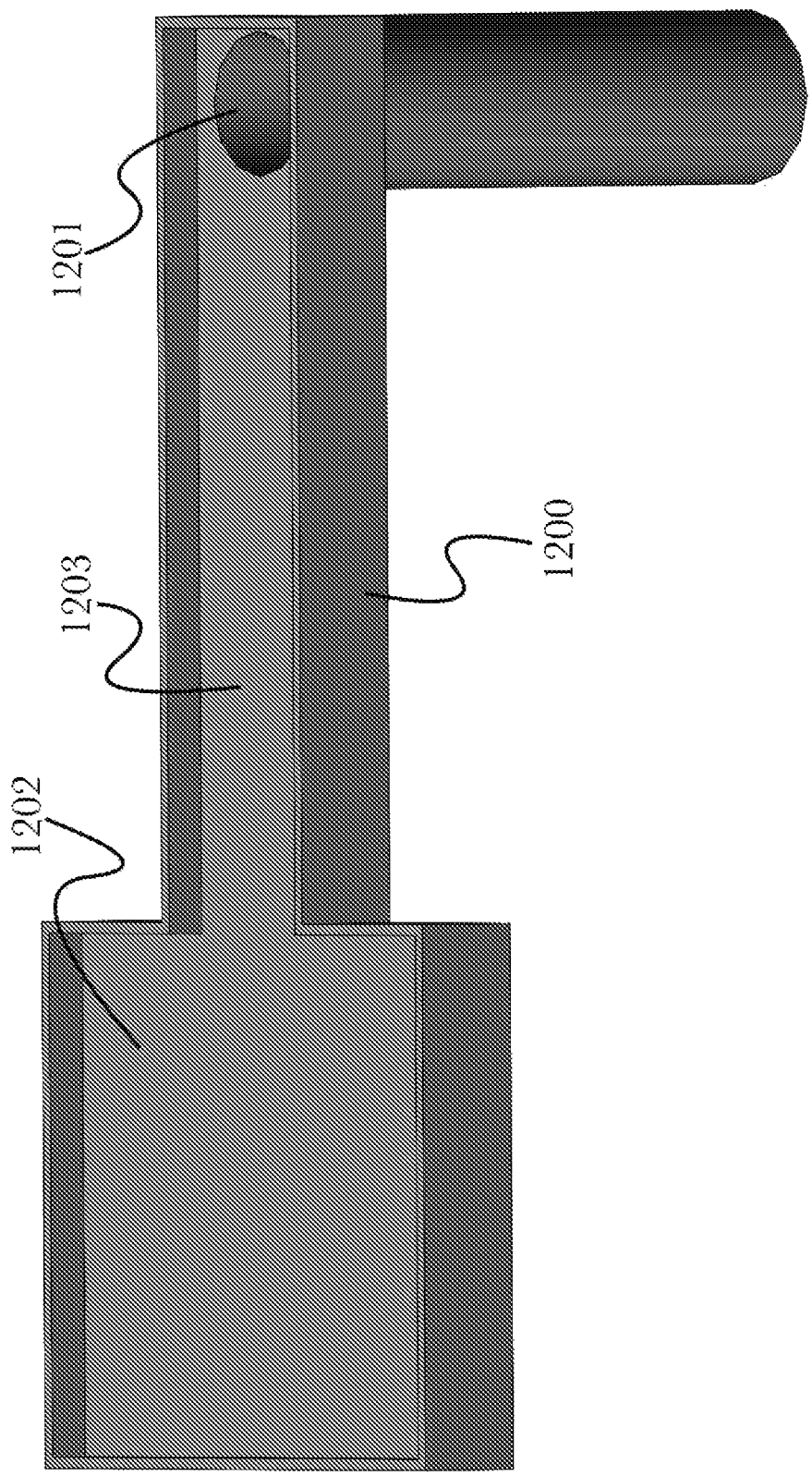
FIG. 12 shows an exemplary conductive structure comprising a through-hole via and a connector pad, etched into a resistive dielectric layer.

FIG. 12 shows an exemplary conductive structure comprising a through-hole via 1201 and a connector pad 1202, etched into a resistive dielectric layer 1200. According to the embodiment, structures may be etched into a resistive dielectric layer (RDL) 1200 for later filling with a conductive material (such as using a powder of metal particles, as described previously). As illustrated, a structure may be formed from the RDL 1200 as an etched "trench" 1203 that may comprise a larger planar portion to form a connector pad 1202 once filled, a trench portion 1203 that forms a conductive line once filled, and a hole 1201 through RDL 1200, that will be later filled to form a through-hole via. These structures may be etched using chemical mechanical polishing, as described below (referring to FIG. 13), enabling selective etching of portions of an RDL to form complex shapes and multi-layer structures. After etching, a damascene process may be used to deposit barrier and seed layers on the surfaces of the structure, and then fill with conductive material to form the final conductive structure within the RDL in a single operation.

Figure 13:
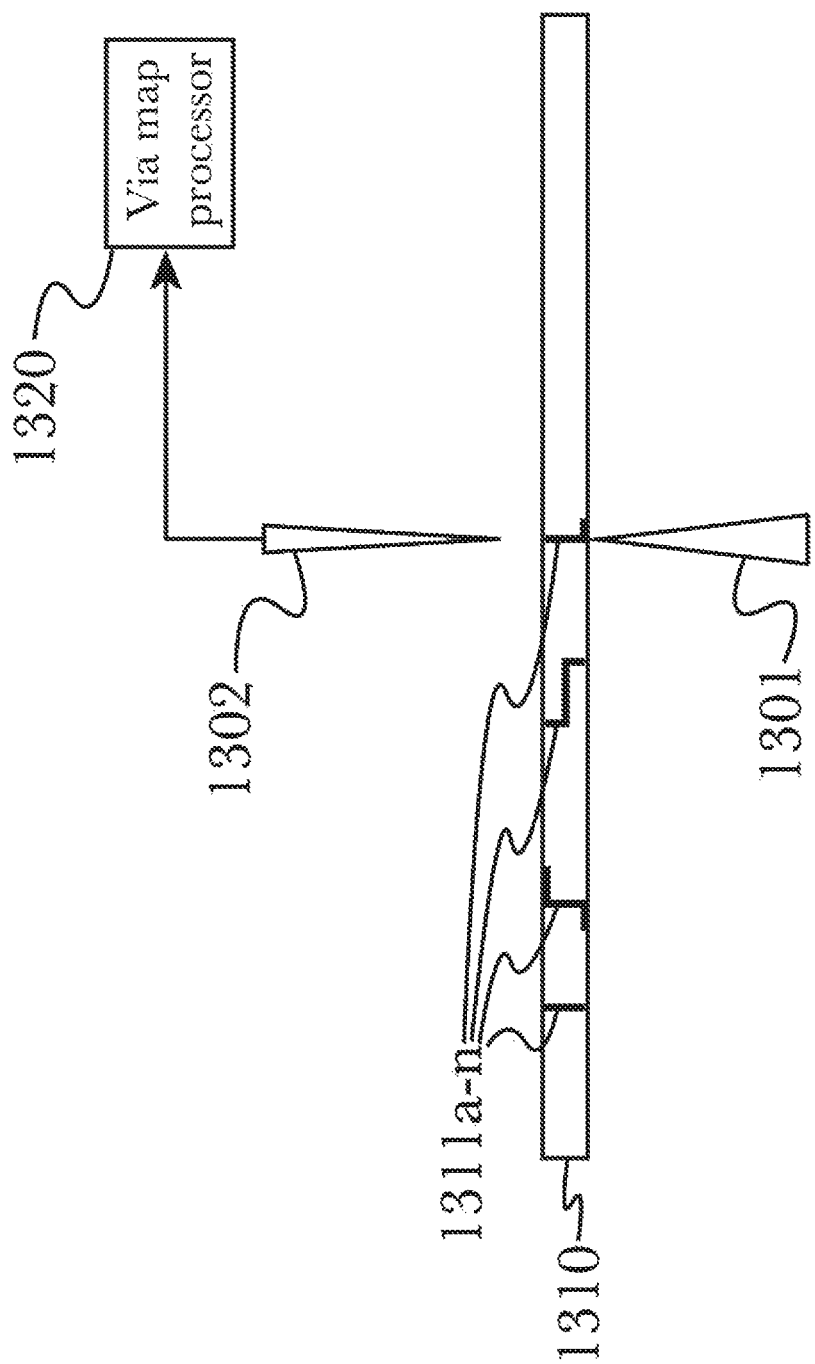
FIG. 13 (PRIOR ART) shows an exemplary process for a dual-damascene manufacturing process for producing lines and through-hole vias in a single manufacturing process illustrating a trench-then-via process.

FIG. 13 (PRIOR ART) shows an exemplary process for a dual-damascene manufacturing process for producing lines and through-hole vias in a single manufacturing process illustrating a trench-then-via process. A dual-damascene process creates lines and vias by etching trenches and holes into an RDL, then depositing conductive material (such as a powder of metal particles) into these etched features. This utilizes a single etching step to make holes through the RDL to form connections with underlying material, and a second etching step to make trenches that will later form conductive lines once filled. According to the embodiment, these two etching steps may be performed in a trench-then-via order, etching the trenches to form lines first, and then etching the holes to form vias second.

Initially, a resistive template may be placed on an RDL, providing a negative pattern with gaps 1301 through which the RDL may be etched to form desired initial patterns. This etching step may utilize CMP to allow the etching to stop 1302 when a selected material layer is reached, providing fine control over the depth and shape of etched patterns. The resistive template may then be removed and a second etching step 1303 removes additional material along the exposed faces, producing a stepped structure and a hole that passes through the RDL to the underlying silicon wafer. A barrier layer 1304 (such as titanium nitride, for example) is then deposited to prevent copper diffusion and mixing of materials between layers. Then, a conductive seed layer 1305 is deposited such as by using physical vapor deposition (PVD), and then the final copper fill is deposited to fill in the structure 1306. This process produces complex structures in a simplified manner using a single fill operation, without the need for subtractive etching or multiple fill steps, reducing waste material and increasing production throughput while also allowing for more fine-tuned control over the structure shape and variance in material layers through selective etching using CMP.

The use of chemical mechanical polishing and planarization (CMP) in a dual-damascene process enables selective fill and etching of features and structures with improved step coverage of subsequent layer deposition and reduced variation in thickness of an RDL. This allows the manufacture of multi-level structures by stopping a polishing operation when a non-selective layer is reached, whereas traditional lapping methods remove all materials at the same rate and do not provide the selectivity needed to form complex structures. By using CMP in a dual-damascene process, these selective layers may be implemented to enable complex multi-layer structures to be etched for filling, as illustrated.

Figure 14:
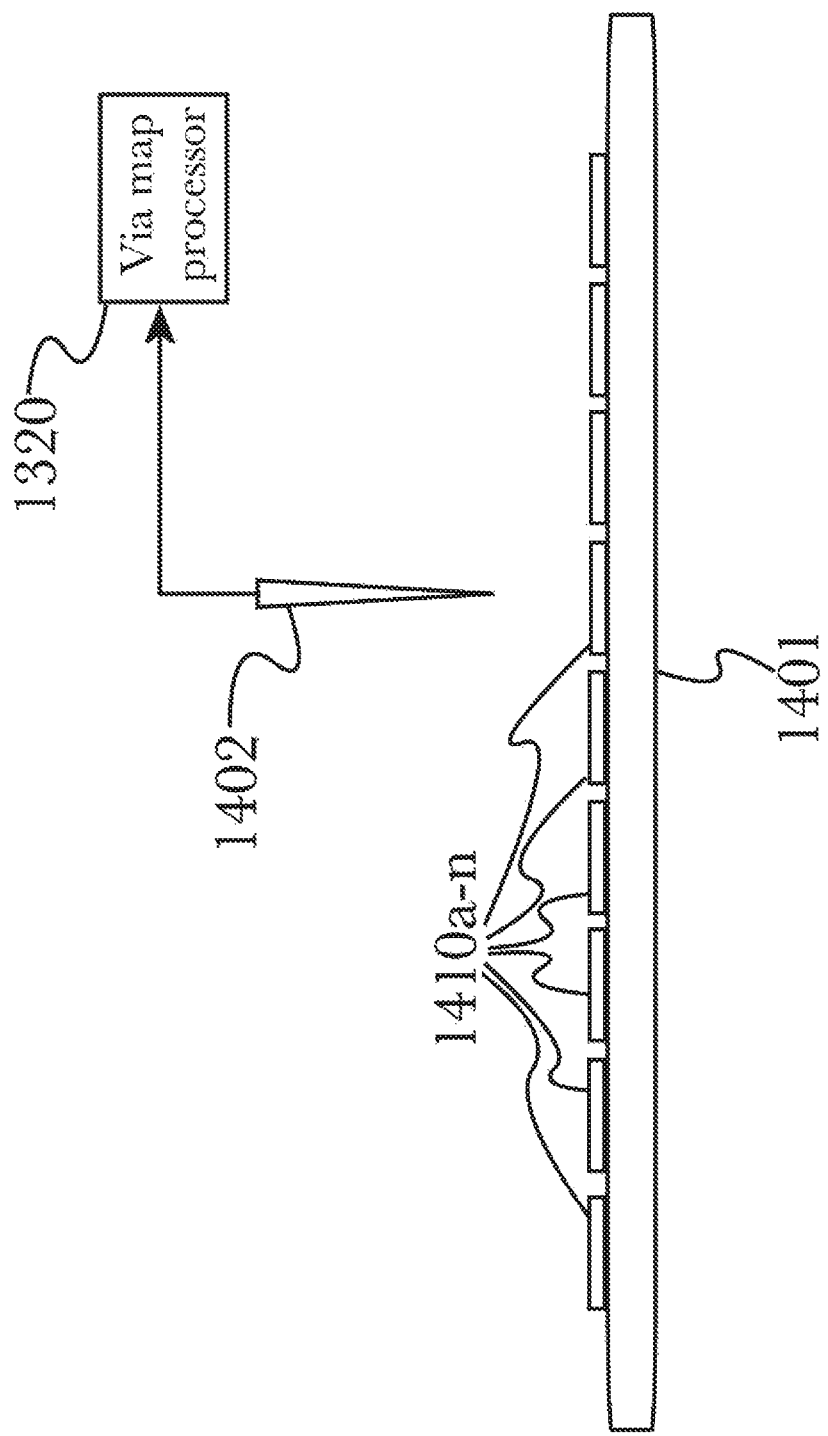
FIG. 14 (PRIOR ART) shows an exemplary process for a dual-damascene manufacturing process for producing lines and through-hole vias in a single manufacturing process illustrating a via-then-trench process.

FIG. 14 (PRIOR ART) shows an exemplary process for a dual-damascene manufacturing process for producing lines and through-hole vias in a single manufacturing process illustrating a via-then-trench process. A dual-damascene process creates lines and vias by etching trenches and holes into an RDL, then depositing conductive material (such as a powder of metal particles) into these etched features. This utilizes a single etching step to make holes through the RDL to form connections with underlying material, and a second etching step to make trenches that will later form conductive lines once filled. According to the embodiment, these two etching steps may be performed in a via-then-trench order, etching the holes to form vias first, and then etching the trenches to form lines second.

According the via-then-trench process of the embodiment, a resistive template may first be placed on an RDL to provide a negative pattern for initial etching 1401. This initial pattern may be etched completely through the RDL to form holes 1402, that will later form through-hole vias when complete. The template may then be removed and a second etching step is used to remove additional material on exposed surfaces 1403, creating larger trenches above the hole. A barrier layer is then deposited 1404, then a conductive seed layer 1405, and finally a conductive fill 1406 that forms the final conductive structures including conductive lines and vias in a single fill step. In this manner, complex structures may be formed in an alternative process to the trench-then-via process described above (referring to FIG. 13), producing similar results with a similarly simple manufacturing process that utilizes a single fill operation to complete conductive structures in an RDL.

Changes and modifications may be made to the disclosed embodiments without departing from the scope of the present disclosure. For example, in some cases nanoparticles may have a range of properties in addition to the ones discussed in detail, such as, for example, thermal conduction and good emissivity. Additionally, absorption or reflection over a range of wavelengths may include optical, IR, UV and X-ray. Also, hermeticity, hydrophobic or hydrophilic properties may vary; as well as specific chemical adsorption or channeling properties that may be utilized in the construction of 3-D structures in silicon, quartz, glass, and polymers where the filling and densification process described herein provides for significantly improved properties in contrast to the inclusion of resins, adhesives and other chemical additives used for ease of filling, dispersion or printing into or onto these geometries, which inclusion in many cases negatively alters in whole or in part the desired properties of the nanoparticles used. These and other changes or modifications are intended to be included within the scope of the present disclosure, as expressed in the following claims.

Figure 15:
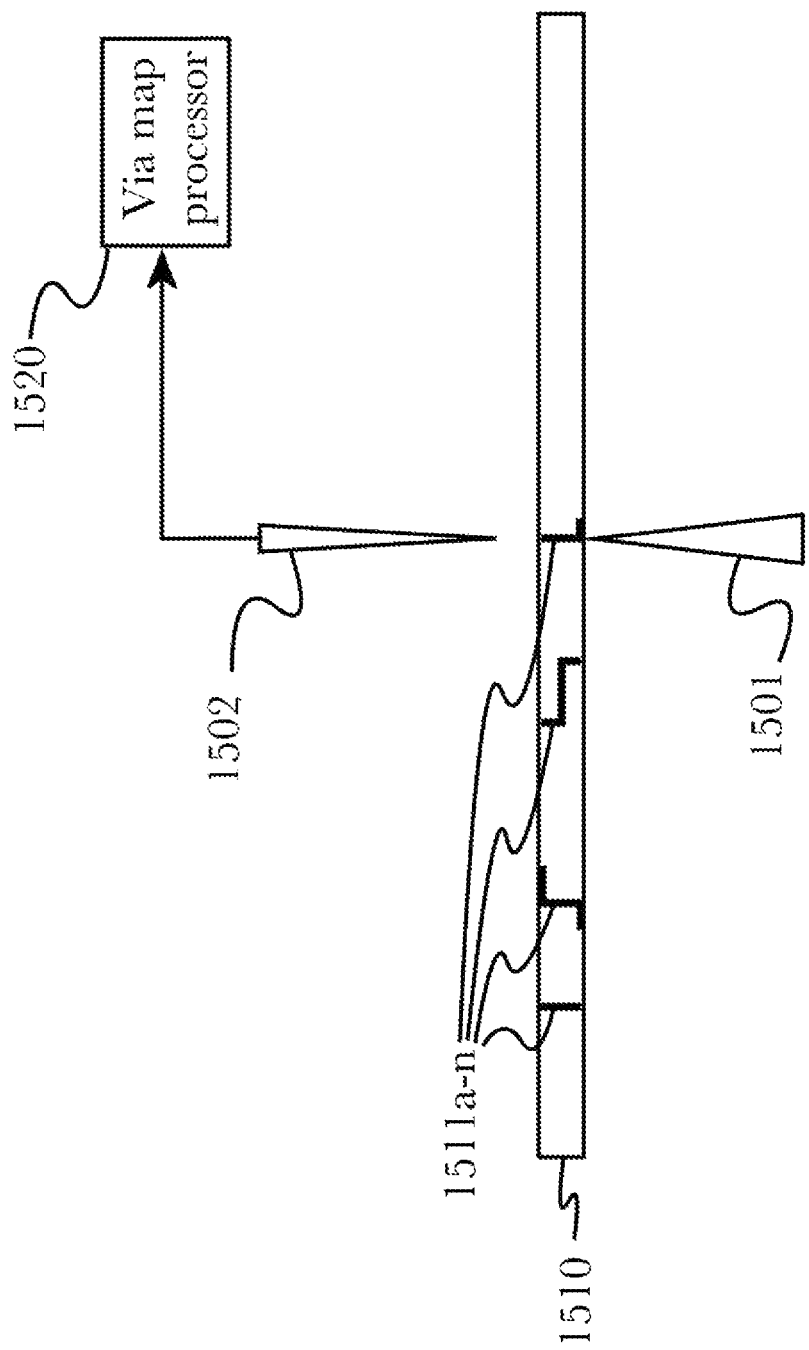
FIG. 15 shows an exemplary apparatus for performing voltage imaging to test a wafer with conductive structures.

FIG. 15 shows an exemplary apparatus for performing voltage imaging to test a wafer with conductive structures. When producing complex conductive structures, it is important to be able to test the integrity of these structures during manufacture and ensure that they have all been properly filled and conduct electricity as intended. This may be accomplished using either of two methods, or by combining the two methods for a more thorough test (or to test the efficacy of one method by comparing and contrasting the results with the second). The first method utilizes voltage imaging techniques to run voltage through the filled structures 1511a-n within a wafer 1510 after they have been completed, by using an electrode 1501 to apply voltage to one surface of wafer 1510 and then use a voltage sensor 1502 to detect and record the resultant voltage on the reverse surface (after it has passed through the conductive structures, vias, trenches, etc). This can then be modeled by a via map processor 1520 as greyscale imagery, wherein the conductive structures 1511a-n may be represented as pixels in an image, with the grey values corresponding to the voltage detected by sensor 1502 when current is applied. This resultant image, or via map, provides an easily-interpreted representation of test results for rapid quality checking. If the detected voltage exceeds a difference threshold from the source (the voltage applied to the opposite surface of the wafer by electrode 1501), it can be inferred that there is a flaw in the conductive structure such as an incomplete fill or foreign contaminants in the fill material.

Figure 16:
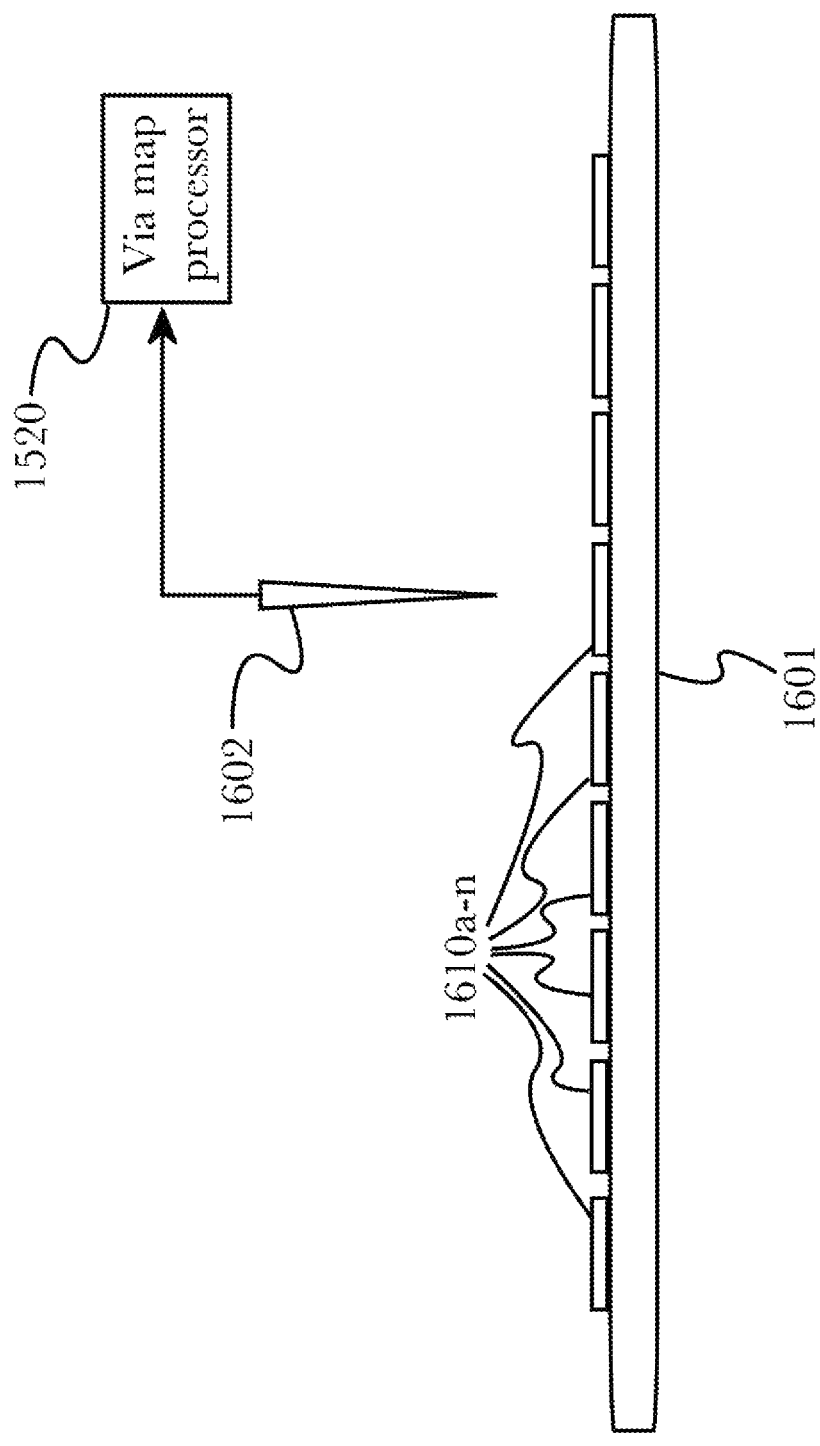
FIG. 16 shows an exemplary apparatus for performing thermal imaging to test multiple wafers with conductive structures.

FIG. 16 shows an exemplary apparatus for performing thermal imaging to test multiple wafers with conductive structures. This testing method uses a variant of voltage imaging that comprises a similar technique using thermal, rather than electric, conductivity. Heat may be applied to one surface of a wafer 1610a-n, for example by placing multiple wafers 1610a-n for testing on a heated surface 1601 to be imaged in batches. Heat is conducted through conductive trenches, vias, and complex structures to the opposite surface of the wafers 1610a-n, which may then be scanned using an infrared imaging sensor 1602 to record the surface temperature measurements at each point on the surface of each wafer 1610a-n. A via map processor 1620 may then produce a via map indicating the thermal conductivity of the structures in a wafer, for example as a greyscale image wherein the grey value of each pixel is based on the temperature measurement at that point on the wafer's surface. As with voltage-based imaging described above in FIG. 15, it may be inferred that a particular structure is flawed if its thermal conductivity exceeds an acceptable variance threshold. This technique requires more time to allow heat to be properly conducted through the wafers, but provides a method to easily test many wafers in large batch operations, offsetting the time necessary for each testing operation. Both testing methods (the voltage imaging approach of FIG. 15 and the thermal imaging approach of FIG. 16) provide a nondestructive way to verify the quality of each individual conductive structure in a wafer, integrating quality-control into the manufacture of complex conductive structures using the new techniques described herein.

The skilled person will be aware of a range of possible modifications of the various embodiments described above. Accordingly, the present invention is defined by the claims and their equivalents.

What is claimed is:

1. A method for creating electrically or thermally conductive vias in a glass substrate, the method comprising the steps of:
   depositing a powder of copper particles on a first side of the glass substrate having holes so as to define a deposited powder of copper particles in the holes, wherein the powder includes micron sized copper particles;
   drying the deposited powder of copper particles after the powder has been exposed to a non-polar solvent; and
   depositing the powder on a reverse side of the glass substrate and into the holes.

2. The method of claim 1, wherein the copper particles are coated with silver.

3. The method of claim 1, further comprising the steps of encapsulating the glass substrate in a polymer envelope and subjecting the polymer envelope to vacuum sealing to create a tight seal between the glass substrate and an inner layer of the polymer envelope.

4. The method of claim 3, further comprising the step of subjecting the polymer envelope to an isostatic pressure.

5. The method of claim 4, wherein the subjecting step further comprises the step of subjecting the polymer envelope to the isostatic pressure and a constant temperature to maximize via fill density and to cause particle-to-particle bonding or sintering of the copper particles.

6. The method of claim 5, wherein the constant temperature is selected based at least on a material type of the copper particles and a via aspect ratio of the glass substrate.

7. The method of claim 6, wherein the encapsulating step and the subjecting steps are performed after the first depositing step and prior to the second depositing step.

8. The method of claim 7, further comprising performing the encapsulating step and the subjecting steps after the second depositing step.

9. The method of claim 1, further comprising the step of depositing the powder into a trench formed in the glass substrate, and drying the powder in the trench.

10. The method of claim 9, further comprising the steps of:
    encapsulating the glass substrate in a polymer envelope after the step of depositing the powder into the trench, and subsequently subjecting the polymer envelope to vacuum sealing to create a tight seal between the glass substrate and an inner layer of the polymer envelope; and
    after the encapsulating step, subjecting the polymer envelope to an isostatic pressure.

11. The method of claim 1, further comprising the step of polishing the powder of copper particles after the depositing steps.

12. The method of claim 1, further comprising the step of polishing the powder of copper particles into the holes.

13. The method of claim 1, further comprising repeating the depositing steps.

14. The method of claim 1, further comprising the step of sintering the powder.

15. The method of claim 1, wherein the resulting thermally or electrically conductive vias are finished to be planar to a surface of the glass substrate.

16. The method of claim 1, further comprising the step of applying rotational and vibratory forces to the glass substrate to achieve a desired fill density of the holes.

17. The method of claim 1, wherein the drying step comprises applying a vacuum to the powder.

* * * * *